United States Patent
Koyama

(10) Patent No.: US 10,998,198 B2
(45) Date of Patent: May 4, 2021

(54) SUBSTRATE PROCESSING METHOD AND SUBSTRATE PROCESSING APPARATUS

(71) Applicant: TOKYO ELECTRON LIMITED, Tokyo (JP)

(72) Inventor: Kazuya Koyama, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/232,645

(22) Filed: Dec. 26, 2018

(65) Prior Publication Data
US 2019/0206695 A1  Jul. 4, 2019

(30) Foreign Application Priority Data
Dec. 28, 2017 (JP) .............................. JP2017-254141

(51) Int. Cl.
*H01L 21/311* (2006.01)
*H01L 21/67* (2006.01)

(52) U.S. Cl.
CPC .. *H01L 21/31111* (2013.01); *H01L 21/67086* (2013.01)

(58) Field of Classification Search
CPC ......... H01L 21/31111; H01L 21/67086; H01L 21/30604
See application file for complete search history.

(56) References Cited

U.S. PATENT DOCUMENTS 7,332,054 B2* 2/2008 Ballantine ......... H01L 21/31111
                                                     134/1.3

FOREIGN PATENT DOCUMENTS

JP      2015056631 A    3/2015

* cited by examiner

*Primary Examiner* — Duy Vu N Deo
*Assistant Examiner* — Mahmoud Dahimene
(74) *Attorney, Agent, or Firm* — Nath, Goldberg & Meyer; Jerald L. Meyer

(57) ABSTRACT

There is provided a substrate processing method for performing an etching processing by immersing a substrate in a processing liquid containing a chemical liquid and silicon, the substrate processing method including: a preparation step of setting a supply flow rate of the chemical liquid based on a replenishment amount of the chemical liquid and a replenishment amount of the silicon; and a replenishment step of supplying the chemical liquid at the set supply flow rate of the chemical liquid and dissolving a set replenishment amount of the silicon in the processing liquid.

7 Claims, 8 Drawing Sheets

SUBSTRATE PROCESSING METHOD AND SUBSTRATE PROCESSING APPARATUS

CROSS-REFERENCE TO RELATED APPLICATION

This application claims the benefit of Japanese Patent Application No. 2017-254141, filed on Dec. 28, 2017, in the Japan Patent Office, the disclosure of which is incorporated herein in its entirety by reference.

TECHNICAL FIELD

Embodiments disclosed herein relate to a substrate processing method and a substrate processing apparatus.

BACKGROUND

Conventionally, a technique has been known for performing an etching processing on a substrate by immersing the substrate in a processing liquid containing a chemical liquid and silicon. In such a technique, when the processing liquid is decreased, the silicon concentration of the treatment liquid is adjusted to a predetermined concentration by immersing a dummy substrate in the processing liquid replenished with the chemical liquid and the processing liquid is replenished.

However, in the substrate processing method described above, since the dummy substrate is immersed in the processing liquid after replenishing the chemical liquid, the step of replenishing the chemical liquid and the step of adjusting the silicon concentration are performed separately. Thus, in the above substrate processing method, the number of working steps increases, and thus there is a concern that the replenishment time of the processing liquid may be prolonged.

SUMMARY

An embodiment of the present disclosure provides a substrate processing method and a substrate processing apparatus that shorten the replenishment time of the processing liquid.

According to one embodiment of the present disclosure, there is provided a substrate processing method for performing an etching processing by immersing a substrate in a processing liquid containing a chemical liquid and silicon, the substrate processing method including: a preparation step of setting a supply flow rate of the chemical liquid based on a replenishment amount of the chemical liquid and a replenishment amount of the silicon; and a replenishment step of supplying the chemical liquid at the set supply flow rate of the chemical liquid and dissolving a set replenishment amount of the silicon in the processing liquid.

According to another embodiment of the present disclosure, there is provided a substrate processing apparatus including: a processing tank configured to perform an etching processing by immersing a substrate in a processing liquid containing a chemical liquid and silicon; a chemical liquid supply part configured to supply the chemical liquid to the processing tank; a substrate lifting mechanism configured to hold a dummy substrate and immerse the dummy substrate in the processing liquid of the processing tank; a controller configured to control the chemical liquid supply part and the substrate lifting mechanism; and a storage part configured to store data relating to a replenishment amount of the chemical liquid and a replenishment amount of the silicon with respect to a silicon concentration, wherein the controller reads the data based on a predetermined concentration of the silicon before replenishment of the chemical liquid and sets a supply flow rate of the chemical liquid based on the data.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments of the substrate processing method and the substrate processing apparatus of the present application, examples of which are illustrated in the accompanying drawings. The present disclosure is not limited to the embodiments described below. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
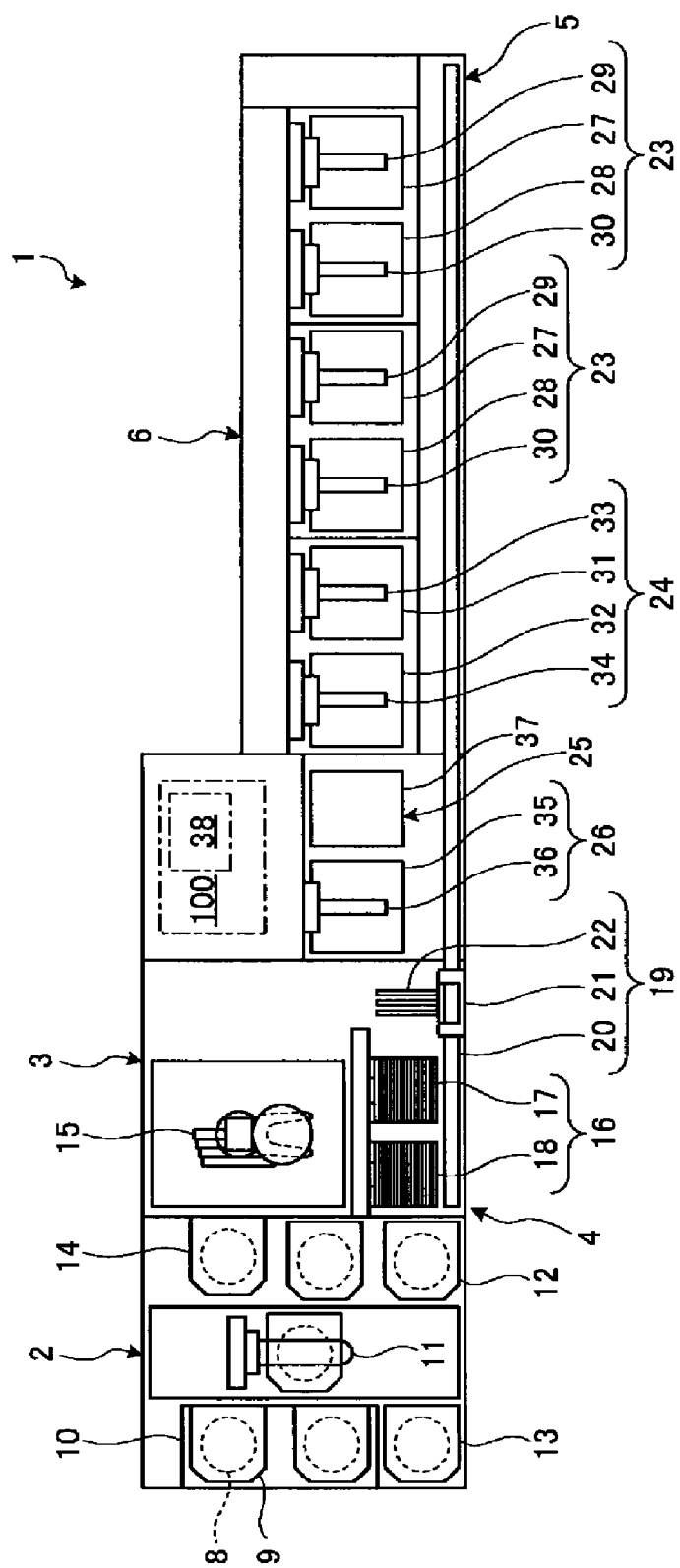
FIG. 1 is a schematic plan view illustrating a substrate processing apparatus.

As illustrated in FIG. 1, a substrate processing apparatus 1 according to an embodiment of the present disclosure includes a carrier carry-in/out part 2, a lot formation part 3, a lot mounting part 4, a lot transport part 5, a lot processing part 6, and a controller 100. FIG. 1 is a schematic plan view illustrating the substrate processing apparatus 1. Here, a direction orthogonal to a horizontal direction will be described as a vertical direction.

The carrier carry-in/out part 2 performs carry-in/out of a carrier 9, which accommodates therein a plurality of substrates (silicon wafers) 8 (e.g., 25 sheets) aligned vertically in a horizontal posture.

The carrier carry-in/out part 2 is provided with a carrier stage 10 on which a plurality of carriers 9 are placed, a carrier transport mechanism 11 which transports the carriers 9, carrier stocks 12 and 13 which temporarily store the carriers 9 therein, and carrier mounting tables 14 on which the carriers 9 are placed.

The carrier carry-in/out part 2 transports the carriers 9, which are carried from the outside into the carrier stage 10, to the carrier stock 12 or the carrier mounting tables 14 using the carrier transport mechanism 11. That is, the carrier carry-in/out part 2 transports the carriers 9, each accommodating therein the plurality of substrates 8 before processing in the lot processing part 6, to the carrier stock 12 or the carrier mounting tables 14.

The carrier stock 12 temporarily stores the carriers 9, each accommodating therein the plurality of substrates 8 before processing in the lot processing part 6.

The plurality of substrates 8 are carried out from a carrier 9, which is transported to the carrier mounting table 14 and accommodates therein a plurality of substrates 8 before processing in the lot processing part 6, by a substrate transport mechanism 15 to be described later.

In addition, a plurality of substrates 8 after processing in the lot processing part 6 are carried into the carrier 9, which is placed on a carrier mounting table 14 and does not accommodate therein a substrate 8, by the substrate transport mechanism 15.

The carrier carry-in/out part 2 transports the carrier 9, which is placed on the carrier mounting table 14 and accommodates therein the plurality of substrates 8 after processing in the lot processing part 6, to the carrier stocks 13 or the carrier stage 10 using the carrier transport mechanism 11.

The carrier stocks 13 temporarily store the plurality of substrates 8 after processing in the lot processing part 6. The carrier 9, which is transported to the carrier stage 10, is carried out to the outside.

The lot formation part 3 is provided with the substrate transport mechanism 15, which transports a plurality of substrates 8 (e.g., 25 sheets). The lot formation part 3 performs transportation of the plurality of substrates 8 (e.g., 25 sheets) twice using the substrate transport mechanism 15 and forms a lot composed of the plurality of substrates 8 (e.g., 50 sheets).

The lot formation part 3 uses the substrate transport mechanism 15 to transport a plurality of substrates 8 from the carriers 9 placed on the carrier mounting table 14 to the lot mounting part 4, and to place the plurality of substrates 8 in the lot mounting part 4, thereby forming a lot.

The plurality of substrates 8 forming a lot are simultaneously processed by the lot processing part 6. When forming a lot, the lot may be formed such that the pattern-formed surfaces of a plurality of substrates 8 face each other, or may be formed such that all the pattern-formed surfaces of the plurality of substrates 8 are oriented in one direction.

The lot formation part 3 transports the plurality of substrates 8 from a lot mounting part 4, which is processed in the lot processing part 6 and placed on the lot mounting part 4, to a carrier 9 using the substrate transport mechanism 15.

The substrate transport mechanism 15 includes two kinds of substrate support parts configured to support a plurality of substrates 8, i.e., a pre-processing substrate support part (not illustrated), which supports the plurality of substrates 8 before processing and a post-processing substrate support part (not illustrated), which supports the plurality of substrates 8 after processing. This makes it possible to prevent particles attached to the plurality of substrates 8 before processing and the like from being transferred and attached to the plurality of substrates 8 after processing.

The substrate transport mechanism 15 changes a posture of the plurality of substrates 8 from the horizontal posture to the vertical posture, and from the vertical posture to the horizontal posture while transporting the plurality of substrates 8.

In the lot mounting part 4, a lot to be transported between the lot formation part 3 and the lot processing part 6 by the lot transport part 5 is temporarily placed (stands by) on a lot mounting table 16.

In the lot mounting part 4, a carry-in side lot mounting table 17 and a carry-out side lot mounting table 18 are provided.

On the carry-in side lot mounting table 17, a lot before processing is placed. On the carry-out side lot mounting table 18, a lot after processing is placed.

On the carry-in side lot mounting table 17 and the carry-out side lot mounting table 18, a plurality of substrates 8 for one lot are placed to be aligned in the front and rear in the vertical posture.

The lot transport part 5 transports lots between the lot mounting part 4 and the lot processing part 6 or between internal portions of the lot processing part 6.

The lot transport part 5 is provided with a lot transport mechanism 19, which performs lot transport. The lot transport mechanism 19 includes a rail 20 disposed along the lot mounting part 4 and the lot processing part 6, and a moving body 21 that moves along the rail 20 while holding a lot thereon.

The moving body 21 is provided with a substrate holder 22, which holds a lot formed of a plurality of substrates 8 arranged in the front and rear in the vertical posture.

The lot transport part 5 receives a lot placed on the carry-in side lot mounting table 17 on the substrate holder 22 of the lot transport mechanism 19, and delivers the received lot to the lot processing part 6.

In addition, the lot transport part 5 receives the lot processed in the lot processing part 6 on the substrate holder 22 of the lot transport mechanism 19, and delivers the received lot to the carry-out side lot mounting table 18.

Further, the lot transport part 5 performs lot transport within the lot processing part 6 using the lot transport mechanism 19.

The lot processing part 6 performs processing such as etching, cleaning, drying, and the like on the lot formed of the plurality of substrates 8 arranged in the front and rear in the vertical posture.

In the lot processing part 6, two etching processing apparatuses 23 which perform an etching processing on a lot, a cleaning processing apparatus 24 which performs a cleaning processing on the lot, a substrate holder cleaning processing apparatus 25 which performs a cleaning processing on the substrate holder 22, and a drying processing apparatus 26 which performs a drying processing on the lot are arranged side by side. The number of etching processing apparatuses 23 is not limited to two, and may be one or three or more.

The etching processing apparatus 23 includes an etching processing tank 27, a rinsing processing tank 28, and substrate lifting mechanisms 29 and 30.

In the etching processing tank 27, a processing liquid for etching (hereinafter, referred to as an "etching liquid") is stored. In the rinsing processing tank 28, a processing liquid for rinsing (e.g., pure water or the like) is stored. Details of the etching processing tank 27 will be described later.

In the substrate lifting mechanisms 29 and 30, the plurality of substrates 8 forming a lot are supported while being arranged in the front and rear in the vertical posture.

The etching processing apparatus 23 receives the lot from the substrate holder 22 of the lot transport mechanism 19 on the substrate lifting mechanism 29, and the received lot is lowered by the substrate lifting mechanism 29 so as to immerse the lot in the etching liquid of the etching processing tank 27, thereby performing the etching processing.

Thereafter, the etching processing apparatus 23 takes the lot out from the etching processing tank 27 by raising the substrate lifting mechanism 29, and delivers the lot from the substrate lifting mechanism 29 to the substrate holder 22 of the lot transport mechanism 19.

Then, the lot is received by the substrate lifting mechanism 30 from the substrate holder 22 of the lot transport mechanism 19, and the received lot is lowered by the substrate lifting mechanism 29 so as to immerse the lot in the processing liquid for rinsing in the rinsing processing tank 28, thereby performing a rinsing processing.

Thereafter, the etching processing apparatus 23 takes the lot out from the rinsing processing tank 28 by raising the substrate lifting mechanism 30, and delivers the lot from the substrate lifting mechanism 30 to the substrate holder 22 of the lot transport mechanism 19.

The cleaning processing apparatus 24 includes a cleaning processing tank 31, a rinsing processing tank 32, and substrate lifting mechanisms 33 and 34.

In the cleaning processing tank 31, a processing liquid for cleaning (e.g., SC-1 or the like) is stored. In the rinsing processing tank 32, a processing liquid for rinsing (e.g., pure water or the like) is stored. In the substrate lifting mechanisms 34 and 34, a plurality of substrates 8 for one lot are supported while being in the front and rear in a vertical posture.

The drying processing apparatus 26 has a processing tank 35 and a substrate lifting mechanism 36, which moves up and down with respect to the processing tank 35.

A processing gas for drying (e.g., isopropyl alcohol (IPA) or the like) is supplied to the processing tank 35. In the substrate lifting mechanism 36, the plurality of substrates 8 for one lot are supported while being arranged in the front and rear in the vertical posture.

The drying processing apparatus 26 receives the lot from the substrate holder 22 of the lot transport mechanism 19 on the substrate lifting mechanism 36, and the received lot is lowered by the substrate lifting mechanism 36 so as to carry the lot into the processing tank 35, thereby performing a drying processing on the lot with the processing gas for drying, which is supplied to the processing tank 35. Then, the drying processing apparatus 26 raises the lot by the substrate lifting mechanism 36, and delivers the lot, which was subjected to the drying processing, from the substrate lifting mechanism 36 to the substrate holder 22 of the lot transport mechanism 19.

The substrate holder cleaning processing apparatus 25 includes a processing tank 37, and is configured to supply a processing liquid for cleaning and a drying gas to the processing tank 37. The substrate holder cleaning processing apparatus 25 performs the cleaning processing of the substrate holder 22 by supplying the processing liquid for cleaning to the substrate holder 22 of the lot transport mechanism 19 and then supplying the drying gas.

Figure 2:
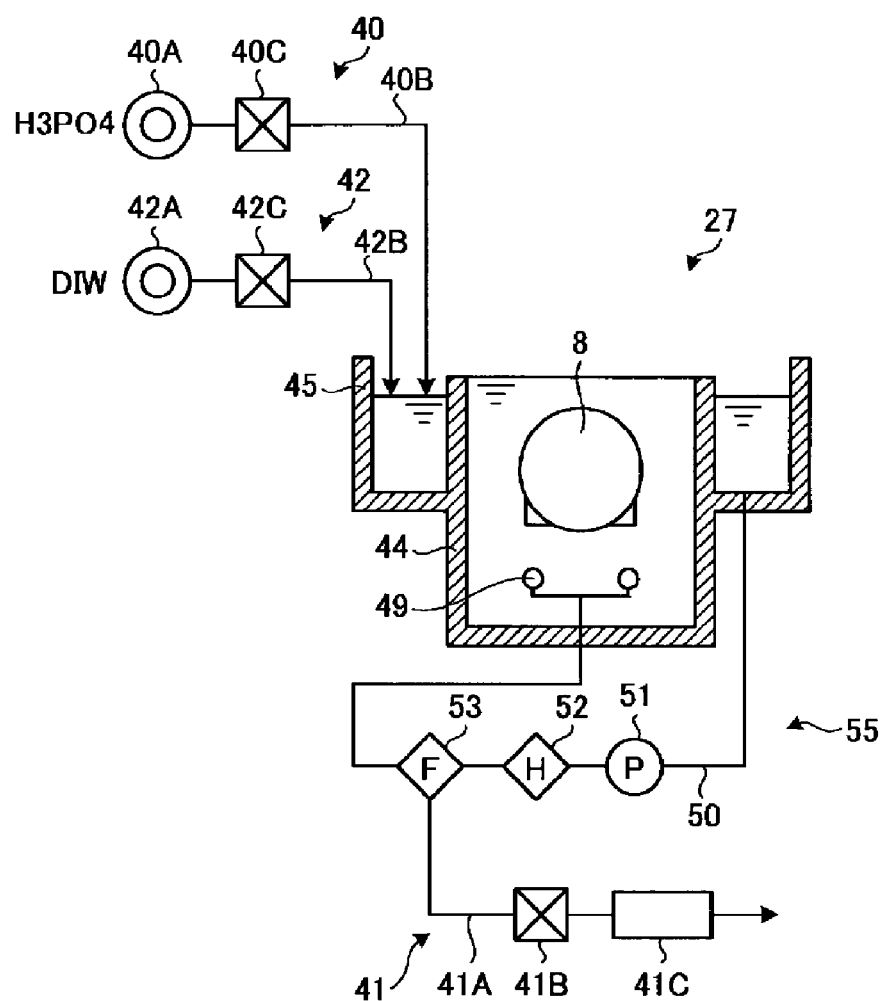
FIG. 2 is a schematic block diagram illustrating a configuration of an etching processing tank according to an embodiment.

Next, the etching processing tank 27 will be described with reference to FIG. 2. FIG. 2 is a schematic block diagram illustrating the configuration of the etching processing tank 27 according to an embodiment.

In the etching processing tank 27, among a silicon nitride film (SiN) and a silicon oxide film ($SiO_2$) formed on a substrate 8, the silicon nitride film is selectively etched.

In the etching processing of the silicon nitride film, a solution, in which a silicon concentration is adjusted by adding a silicon (Si)-containing compound (hereinafter, sometimes simply referred to as "silicon") to the chemical liquid, is used as an etching liquid (processing liquid). The chemical liquid is, for example, a liquid in which an aqueous solution of phosphoric acid ($H_3PO_4$) is diluted with pure water (DIW).

The adjustment of the silicon concentration is carried out by immersing a dummy substrate in the etching liquid in the etching processing tank 27 and dissolving the silicon of the dummy substrate in the etching liquid. The adjustment of the silicon concentration is carried out, for example, by holding dummy substrates (e.g., 50 sheets) in the same manner as the substrate 8, on which an etching processing is actually performed by the substrate lifting mechanism 29, and immersing the dummy substrate in the etching liquid of an inner tank 44.

The etching processing tank 27 has a phosphoric acid aqueous solution supply part 40, a phosphoric acid aqueous solution discharge part 41, a pure water supply part 42, the inner tank 44, and an outer tank 45.

The phosphoric acid aqueous solution supply part 40 includes a phosphoric acid aqueous solution supply source 40A, a phosphoric acid aqueous solution supply line 40B, and a first flow rate regulator 40C.

The phosphoric acid aqueous solution supply source 40A is a tank, which stores the phosphoric acid aqueous solution. The phosphoric acid aqueous solution supply line 40B connects the phosphoric acid aqueous solution supply source 40A and the outer tank 45 so as to supply the phosphoric acid aqueous solution from the phosphoric acid aqueous solution supply source 40A to the outer tank 45.

The first flow rate regulator 40C is provided in the phosphoric acid aqueous solution supply line 40B so as to regulate the flow rate of the phosphoric acid aqueous solution supplied to the outer tank 45. The first flow rate regulator 40C is constituted by an opening/closing valve, a flow rate control valve, a flow meter or the like.

The pure water supply part 42 has a pure water supply source 42A, a pure water supply line 42B, and a second flow rate regulator 42C. The pure water supply part 42 supplies pure water (DIW) to the outer tank 45 in order to replenish water evaporated by heating the etching liquid. Further, the pure water supply part 42 supplies the pure water to the outer tank 45 when replacing a part of the etching liquid or when replenishing the chemical liquid.

The pure water supply line 42B connects the pure water supply source 42A and the outer tank 45 so as to supply the pure water having a predetermined temperature from the pure water supply source 42A to the outer tank 45.

The second flow rate regulator 42C is provided in the pure water supply line 42B so as to adjust a flow rate of pure water to be supplied to the outer tank 45. The second flow rate regulator 42C is constituted by an opening/closing valve, a flow rate control valve, a flow meter or the like.

An upper portion of the inner tank 44 is opened, and the etching liquid is supplied to the vicinity of the upper portion. In the inner tank 44, the lot (the plurality of substrates 8) is immersed in the etching liquid by the substrate lifting mechanism 29 so as to perform an etching processing on the substrates 8.

In the inner tank 44, when the chemical liquid is replenished, a dummy substrate is immersed in the etching liquid, and thus the silicon concentration in the etching liquid is adjusted.

The outer tank 45 is provided around the upper portion of the inner tank 44, and an upper portion of the outer tank 45 is opened. The etching liquid overflowing from the inner tank 44 flows into the outer tank 45. In addition, the outer tank 45 is supplied with a phosphoric acid aqueous solution from the phosphoric acid aqueous solution supply part 40. Further, the outer tank 45 is supplied with pure water from the pure water supply part 42.

When the outer tank 45 is replenished with the chemical liquid, the flow rate of the phosphoric acid aqueous solution and the flow rate of the pure water are controlled such that the phosphoric acid concentration in the replenished chemical liquid becomes a predetermined phosphoric acid concentration, which is set in advance.

The outer tank 45 and the inner tank 44 are connected by a circulation line 50. One end of the circulation line 50 is connected to the outer tank 45, and the other end of the circulation line 50 is connected to the processing liquid supply nozzle 49 installed in the inner tank 44.

The circulation line 50 is provided with a pump 51, a heater 52, and a filter 53 in this order from the outer tank 45 side. The etching liquid in the outer tank 45 is heated by the heater 52 and flows into the inner tank 44 from the processing liquid supply nozzle 49. The heater 52 controls the temperature of the etching liquid supplied to the inner tank 44.

By driving the pump 51, the etching liquid is sent from the outer tank 45 to the inside of the inner tank 44 via the circulation line 50. In addition, the etching liquid flows out to the outer tank 45 again by overflowing from the inner tank 44. In this way, an etching liquid circulation path 55 is formed. That is, the circulation path 55 is formed by the outer tank 45, the circulation line 50, and the inner tank 44. In the circulation path 55, the outer tank 45 is provided on the upstream side of the heater 52 with reference to the inner tank 44.

The phosphoric acid aqueous solution discharging part 41 discharges the etching liquid when all or a part of the etching liquid used in the etching processing is exchanged. The phosphoric acid aqueous solution discharge part 41 includes a discharge line 41A, a third flow rate regulator 41B, and a cooling tank 41C.

The discharge line 41A is connected to the circulation line 50. The third flow rate regulator 41B is provided in the discharge line 41A so as to adjust the discharge amount of the discharged etching liquid. The third flow rate regulator 41B is constituted by an opening/closing valve, a flow rate control valve, a flow meter or the like. The cooling tank 41C temporarily stores and cools the etching liquid flowing thereinto through the discharge line 41A.

The opening/closing of the opening/closing valves constituting the first flow rate regulator 40C, the second flow rate regulator 42C, and the third flow rate regulator 41B, or the opening degrees of the flow rate control valves constituting the first flow rate regulator 40C, the second flow rate regulator 42C, and the third flow rate regulator 41B are changed when an actuator (not shown) operates on the basis of a signal from the controller 100. That is, the opening/closing valves or the flow rate control valves that constitute the first flow rate regulator 40C, the second flow rate regulator 42C, and the third flow rate regulator 41B are controlled by the controller 100.

Returning back to FIG. 1, the controller 100 controls the operations of respective parts (the carrier carry-in/out part 2, the lot formation part 3, the lot mounting part 4, the lot transport part 5, and the lot processing part 6) of the substrate processing apparatus 1. The controller 100 controls the operations of respective parts of the substrate processing apparatus 1 on the basis of signals from a switch or the like.

The controller 100 is constituted with, for example, a computer, and has a computer-readable storage medium 38. In the storage medium 38, a program for controlling various processes executed in the substrate processing apparatus 1 is stored. The storage medium 38 stores data to be described later.

The controller 100 controls the operation of the substrate processing apparatus 1 by reading and executing the program stored in the storage medium 38. In addition, the program may have been stored in the computer-readable storage medium 38 and installed from another storage medium to the storage medium 38 of the controller 100.

The computer-readable storage medium 38 includes, for example, a hard disk (HD), a flexible disk (FD), a compact disk (CD), a magneto-optical disk (MO), and a memory card.

The etching liquid in the etching processing tank 27 is reduced when the etching processing is performed and the etching liquid is transported in the state in which, for example, the etching liquid adheres to a substrate 8. Therefore, the substrate processing apparatus 1 performs adjustment of silicon concentration by replenishing the chemical liquid to the outer tank 45 at a predetermined timing, for example, at the timing when a predetermined number of etching processing are completed. Specifically, the substrate processing apparatus 1 adjusts the silicon concentration of the etching liquid by immersing a dummy substrate in the inner tank 44 and circulating the etching liquid while replenishing the chemical liquid to the outer tank 45.

When the chemical liquid is replenished, the silicon concentration in the etching liquid is lowered. It is known that there is a correlation between the silicon concentration and the etching rate of the silicon oxide film (coating film), and as the silicon concentration decreases, the etching rate of the silicon oxide film on the dummy substrate increases.

Figure 3:
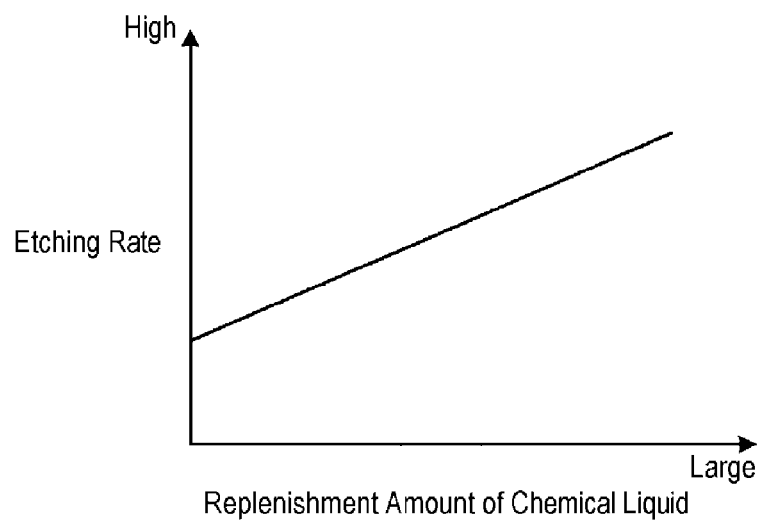
FIG. 3 is a map representing a relationship between a replenishment amount of a chemical liquid and an etching rate of a silicon oxide film.

Therefore, when the chemical liquid is replenished to the etching liquid, the etching rate of the silicon oxide film increases as the replenishment amount of the chemical liquid increases, as shown in FIG. 3. FIG. 3 is a map representing a relationship between the replenishment amount of a chemical liquid and the etching rate of a silicon oxide film. The etching rate of the silicon oxide film varies depending on the temperature of the etching liquid and the concentration of the phosphoric acid aqueous solution. Here, the temperature of the etching liquid is constant, and the concentration of the phosphoric acid aqueous solution is also constant.

Figure 4:
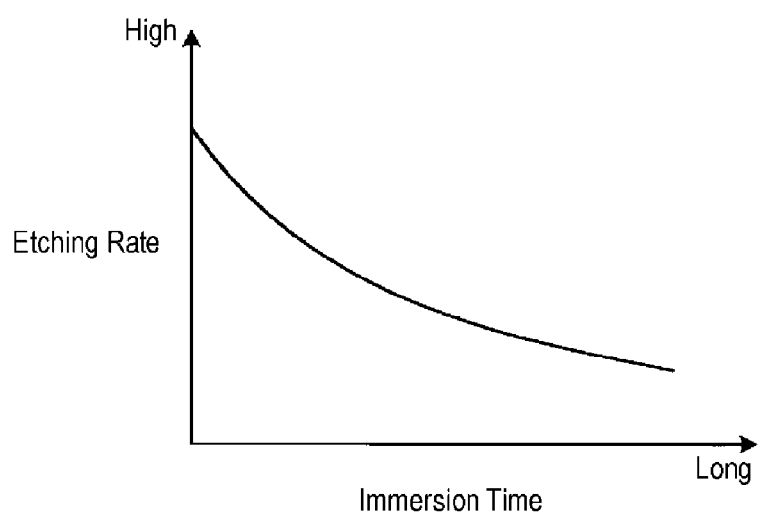
FIG. 4 is a map representing a relationship between an immersion time of a dummy substrate and an etching rate of a silicon oxide film.

Further, when a dummy substrate is immersed in the etching liquid, silicon dissolves from the dummy substrate, and the silicon concentration of the etching liquid increases. Therefore, when the immersion time of the dummy substrate is prolonged, the etching rate of the silicon oxide film becomes small, as represented in FIG. 4. FIG. 4 is a map showing a relationship between the immersion time of a dummy substrate and the etching rate of a silicon oxide film. The temperature of the etching liquid is constant, and the concentration of the phosphoric acid aqueous solution is also constant. Further, the amount of silicon dissolved per unit time varies depending on the number of dummy substrates, the film formation condition of the dummy substrate, and the like. Here, the number of dummy substrates is a predetermined sheet number (e.g., 50 sheets). The film formation condition of the dummy substrates is a predetermined condition.

Figure 5:
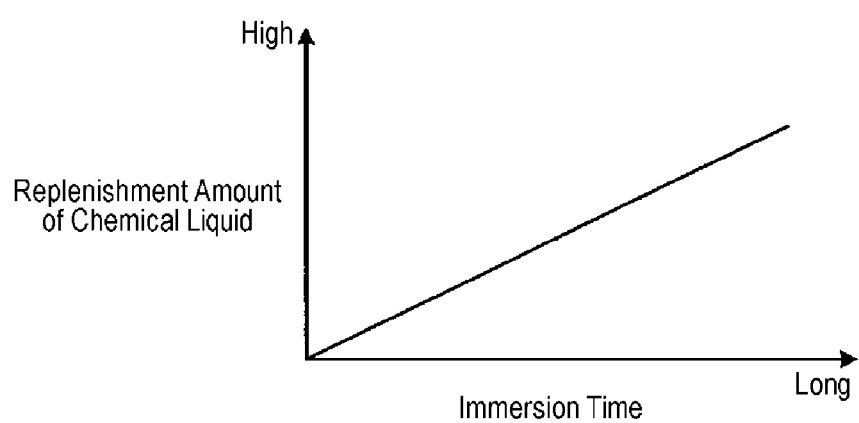
FIG. 5 is a map representing a relationship between an immersion time of a dummy substrate and a replenishment amount of a chemical liquid, which make the etching rate of a silicon oxide film constant.

As described above, the change in the etching rate of a silicon oxide film, i.e., the change in a silicon concentration, is related to the replenishment amount of a chemical liquid and the immersion time of a dummy substrate. Therefore, the relationship between the immersion time of the dummy substrate and the replenishment amount of the chemical liquid, which make the etching rate of the silicon oxide film constant, may be shown as in FIG. 5. FIG. 5 is a map representing a relationship between the immersion time of a dummy substrate and the replenishment amount of a chemical liquid, which make the etching rate of a silicon oxide film constant. In the map shown in FIG. 5, the slope of the straight line indicates a supply flow rate of the chemical liquid that is capable of replenishing the chemical liquid while keeping the silicon concentration of the etching liquid constant.

The relationship between the immersion time of the dummy substrate and the etching rate of the silicon oxide film is not necessarily linear as represented in FIG. 4. However, since the etching rate of the silicon oxide film that is changed when replenishing the chemical liquid is small, it may be linearly approximated within the actual replenishing range. Therefore, from the relationship between the immersion time of the dummy substrate and the etching rate of the silicon oxide film that is linearly approximated, the relationship between the immersion time of the dummy substrate and the replenishment amount of the chemical liquid that makes the etching rate of the silicon oxide film constant may be obtained, as shown in FIG. 5.

Such a map is stored in the storage medium 38 as data for each etching rate of the silicon oxide film, that is, for each silicon concentration. A table or calculation formula corresponding to the map depicted in FIG. 5 may be stored in the storage medium 38 as data. Such data is data relating to the replenishment amount of the chemical liquid and the immersion time of the dummy substrate with respect to a predetermined silicon concentration, and is acquired in advance through experiments or the like and stored in the storage medium 38.

Multiple sets of data may be stored according to, for example, the temperature of the etching liquid, the concentration of the phosphoric acid aqueous solution, the number of dummy substrates, or the film formation state of the dummy substrates. This makes it possible to replenish the chemical liquid while keeping the silicon concentration of the etching liquid constant depending on the temperature of the etching liquid or the like.

In the substrate processing apparatus 1, the chemical liquid is supplied by controlling the supply flow rate of the chemical liquid and the dummy substrate is immersed in the etching liquid such that the silicon concentration of the etching liquid is maintained at a predetermined concentration before replenishing the chemical liquid.

Figure 6:
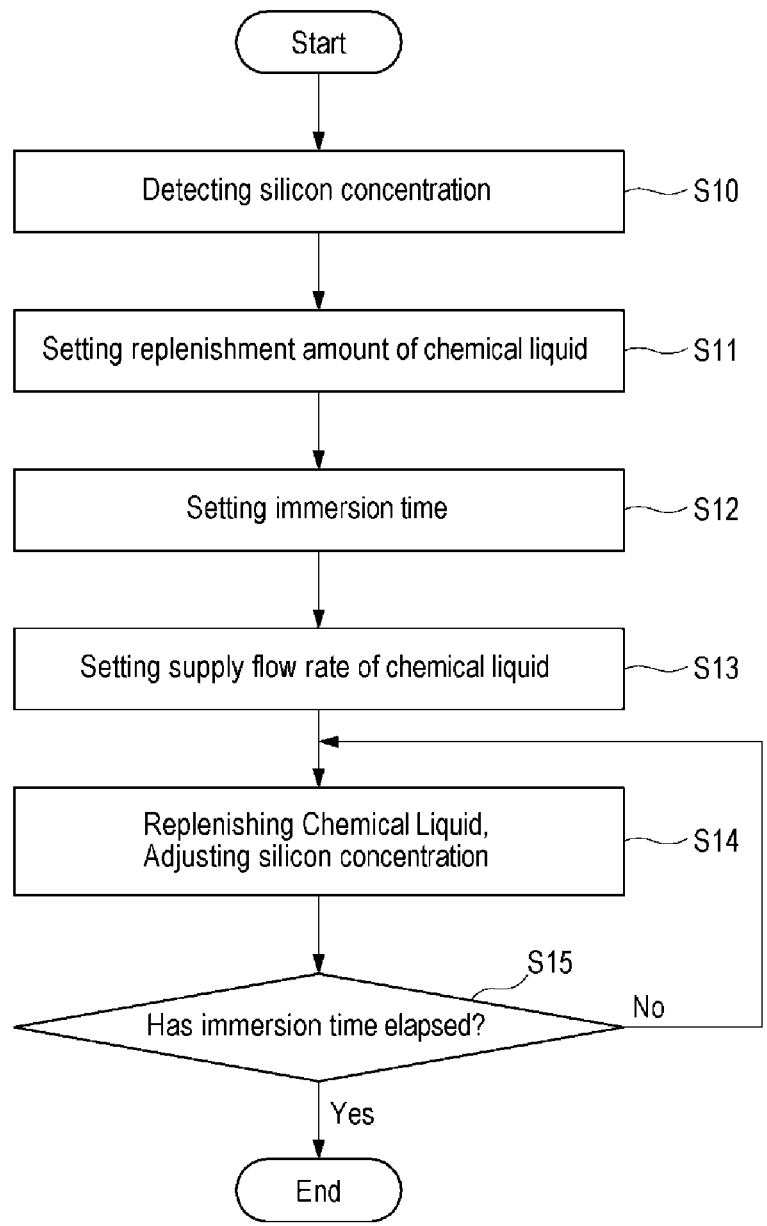
FIG. 6 is a flowchart for explaining replenishing control of an etching liquid.

Next, replenishing control of the etching liquid according to the present embodiment will be described with reference to FIG. 6. FIG. 6 is a flowchart for explaining replenishing control of an etching liquid.

The substrate processing apparatus 1 detects the silicon concentration in the current etching liquid (S10). The substrate processing apparatus 1 detects the etching rate of a silicon oxide film in the current etching liquid and detects the silicon concentration on the basis of the etching rate of the silicon oxide film. The silicon concentration based on the etching rate of the silicon oxide film may be input to the substrate processing apparatus 1 by an operator. In the substrate processing apparatus 1, a silicon concentration sensor may be provided in the circulation path 55, and the silicon concentration may be directly detected from the etching liquid using the silicon concentration sensor.

The substrate processing apparatus 1 sets the replenishment amount of the chemical liquid (S11). For example, the substrate processing apparatus 1 sets the replenishment amount of the chemical liquid on the basis of the difference between the set amount of the etching liquid in the etching processing tank 27 and the current amount of the etching liquid. The replenishment amount of the chemical liquid may be a constant amount set in advance.

The substrate processing apparatus 1 sets the immersion time of the dummy substrate (S12). The substrate processing apparatus 1 sets the immersion time of the dummy substrate with respect to the replenishment amount of the chemical liquid. Specifically, the substrate processing apparatus 1 sets the immersion time of the dummy substrate with respect to the replenishment amount of the chemical liquid from the map represented in FIG. 5. The substrate processing apparatus 1 selects and reads a map corresponding to the detected silicon concentration from among a plurality of maps and sets the immersion time of the dummy substrate based on the selected map. That is, the substrate processing apparatus 1 sets the replenishment amount of silicon.

The substrate processing apparatus 1 sets the supply flow rate of the chemical liquid (S13). The substrate processing apparatus 1 sets the supply flow rate of the chemical liquid from the map used for setting the immersion time of the dummy substrate on the basis of the replenishment amount of the chemical liquid and the immersion time of the dummy substrate. The substrate processing apparatus 1 sets the supply flow rate of the chemical liquid such that the silicon concentration is maintained at a predetermined concentration before the replenishment of the chemical liquid. This step corresponds to the preparation step.

The substrate processing apparatus 1 adjusts the silicon concentration of the etching liquid by replenishing the chemical liquid (S14). The substrate processing apparatus 1 supplies the chemical liquid to the outer tank 45 on the basis of the set supply flow rate of the chemical liquid. The substrate processing apparatus 1 immerses the dummy substrate in the etching liquid of the inner tank 44, and dissolves the silicon in the etching liquid. This step corresponds to the replenishment step.

The substrate processing apparatus 1 determines whether or not the immersion time has elapsed (S15), and when it is determined that the immersion time has elapsed (S15: Yes), the current processing is terminated.

When the immersion time has not elapsed (S15: No), the substrate processing apparatus 1 continues replenishment of the chemical liquid and adjustment of the silicon concentration (S14).

In this way, the substrate processing apparatus 1 sets the supply flow rate of the chemical liquid on the basis of the replenishment amount of the chemical liquid and the replenishment amount of the silicon in response to the decrease of the etching liquid. Then, the substrate processing apparatus 1 immerses the dummy substrate in the etching liquid so as to dissolve the silicon in the etching liquid while supplying the chemical liquid at the set supply flow rate.

Thereby, the substrate processing apparatus 1 is able to replenish the chemical liquid while maintaining the silicon concentration of the etching liquid at a predetermined concentration before replenishing the chemical liquid. That is, the substrate processing apparatus 1 is able to simultaneously perform the step of supplying the chemical liquid and the step of adjusting the silicon concentration.

Therefore, the substrate processing apparatus 1 can reduce the number of working steps in a case, for example, where the chemical liquid is supplied and then the dummy substrate is immersed in the etching liquid, in comparison with a case where the step of supplying the chemical liquid and the step of adjusting the silicon concentration are separately performed. Therefore, the substrate processing apparatus 1 shortens the replenishment time of the etching liquid.

The substrate processing apparatus 1 is able to easily set the supply flow rate of the chemical liquid by setting the supply flow rate of the chemical liquid on the basis of the data on the silicon concentration, the replenishment amount of the chemical liquid, and the immersion time of the dummy substrate.

The substrate processing apparatus 1 is able to maintain the silicon concentration after replenishment of the chemical liquid at a predetermined concentration before replenishment of the chemical liquid by supplying the chemical liquid at the set supply flow rate.

Next, a modification of the substrate processing apparatus 1 according to the present embodiment will be described.

The substrate processing apparatus 1 according to the modification may adjust the silicon concentration by dissolving a silicon-containing compound such as colloidal silica or the like in a phosphoric acid aqueous solution. The substrate processing apparatus 1 according to the modification may adjust the silicon concentration by adding a silicon-containing compound aqueous solution to a phosphoric acid aqueous solution. The substrate processing apparatus 1 according to the modification sets the supply flow rate of the chemical liquid on the basis of, for example, the dissolving amount of silicon-containing compound per unit time and the supply flow rate of the silicon-containing compound aqueous solution. By these methods, it is possible to obtain an effect, which is the same as the substrate processing apparatus 1 according to the embodiment.

In the substrate processing apparatus 1 according to a modification, when replenishing the chemical liquid, the silicon concentration after replenishment of the chemical liquid may be changed. The substrate processing apparatus 1 according to a modification changes the silicon concentration after replenishment of the chemical liquid by changing the supply flow rate of the chemical liquid.

Figure 7:
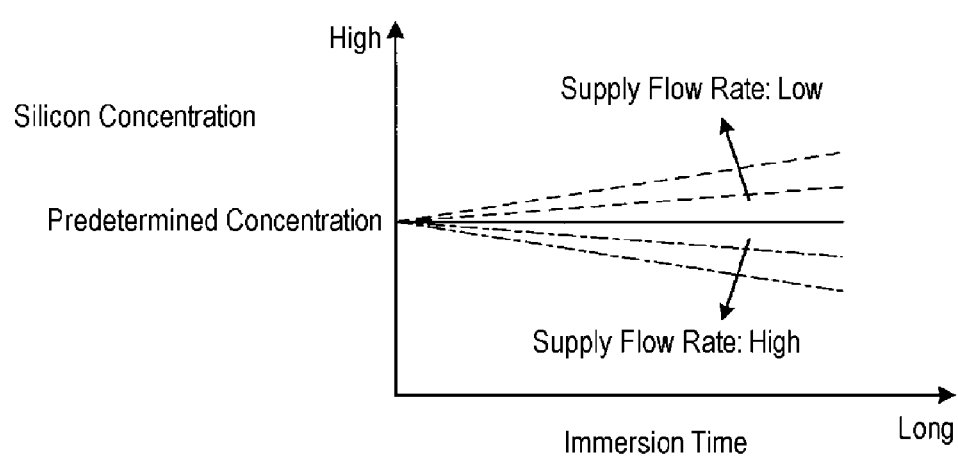
FIG. 7 is a map representing a change in silicon concentration with respect to the supply flow rate of a chemical liquid.

When a replenishment step is performed on the basis of the replenishment amount of the chemical liquid, the immersion time, and the supply flow rate of the chemical liquid, which are set in the preparation step of the embodiments described above, the silicon concentration is not changed but maintained at a predetermined concentration as indicated by a solid line in FIG. 7. FIG. 7 is a map showing a change in silicon concentration with respect to the supply flow rate of a chemical liquid.

When the supply flow rate of the chemical liquid is lower than the supply flow rate at which the silicon concentration is maintained at the predetermined concentration, the silicon concentration becomes higher than a predetermined concentration. As the supply flow rate of the chemical liquid becomes smaller, the silicon concentration becomes higher than the predetermined concentration, as indicated by a broken line in FIG. 7. When the supply flow rate of the chemical liquid is higher than the supply flow rate at which the silicon concentration is maintained at the predetermined concentration, the silicon concentration becomes lower than a predetermined concentration. As the supply flow rate of the chemical liquid becomes higher, the silicon concentration becomes lower than the predetermined concentration, as indicated by an alternating long-and-short dash line in FIG. 7

For example, in the substrate processing apparatus 1 according to the modification, when the silicon concentration is set to be higher than the predetermined concentration before the replenishment of the chemical liquid, the supply flow rate of the chemical liquid is made lower than the supply flow rate of the chemical liquid for maintaining the silicon concentration at the predetermined concentration. For example, in the substrate processing apparatus 1 according to the modification, when the silicon concentration is set to be lower than the predetermined concentration before the replenishment of the chemical liquid, the supply flow rate of the chemical liquid is made higher than the supply flow rate of the chemical liquid for maintaining the silicon concentration at the predetermined concentration. In this way, the substrate processing apparatus 1 according to the modification may change the silicon concentration after replenishment of the chemical liquid by changing the supply flow rate of the chemical liquid.

The substrate processing apparatus 1 according to the modification may detect the silicon concentration during the replenishment of the chemical liquid, and change the supply flow rate of the chemical liquid on the basis of the detected silicon concentration. For example, the substrate processing apparatus 1 according to the modification sets the supply flow rate of the chemical liquid and detects the silicon concentration while replenishing the chemical liquid at the set supply flow rate. Then, when the detected silicon concentration is a concentration different from the predetermined concentration before the replenishment of the chemical liquid, the substrate processing apparatus 1 according to the modification may change the set supply flow rate of the chemical liquid such that the silicon concentration becomes the predetermined concentration before the replenishment of the chemical liquid.

Thereby, the substrate processing apparatus 1 according to the modification is able to adjust the silicon concentration during the replenishment of the chemical liquid and the silicon concentration after the replenishment of the chemical liquid to a desired silicon concentration, with a high degree of accuracy.

Figure 8:
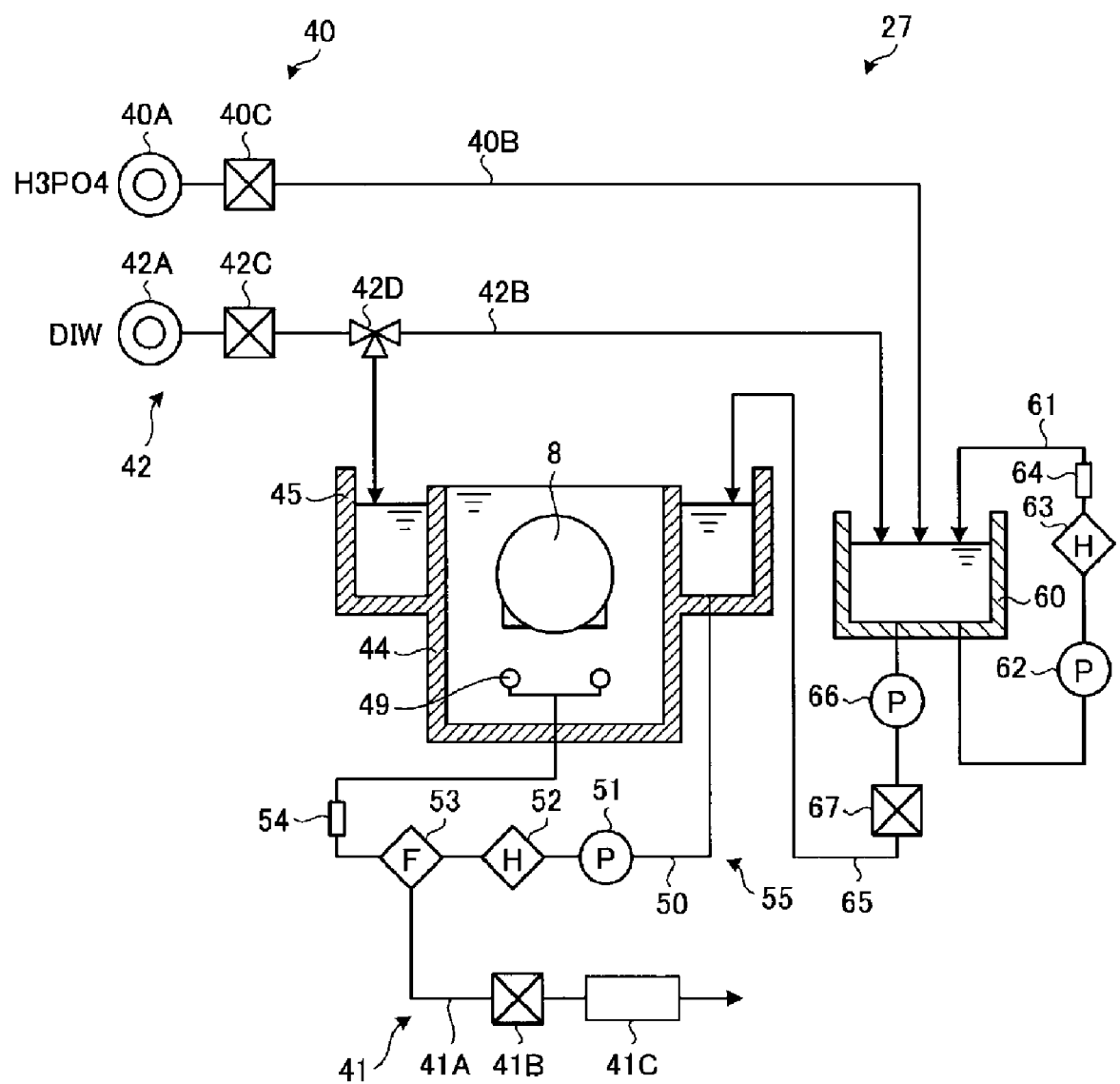
FIG. 8 is a schematic block diagram illustrating the configuration of an etching processing tank according to a modification.

As illustrated in FIG. 8, the substrate processing apparatus 1 according to the modification may have a reserve tank 60. FIG. 8 is a schematic block diagram illustrating the configuration of an etching processing tank 27 according to a modification. In the substrate processing apparatus 1 according to the modification, a silicon concentration sensor 54, which detects the silicon concentration of the etching liquid, is provided in the circulation path 55, and the silicon concentration in the current etching liquid is detected by the silicon concentration sensor 54.

A chemical liquid is supplied to a reserve tank 60. That is, a phosphoric acid aqueous solution is supplied to the reserve tank 60 from the phosphoric acid aqueous solution supply part 40, and pure water (DIW) is supplied from the pure water supply part 42. In the pure water supply line 42B, for example, a three-way valve 42D is provided, and the supply of pure water is able to be switched to the outer tank 45 or the reserve tank 60 by the three-way valve 42D.

In the reserve tank 60, a replenishing liquid, which is an etching liquid for replenishing the reduced etching liquid, is generated. The reserve tank 60 is connected to a circulation line 61 so as to circulate the replenishing liquid in the reserve tank 60. The circulation line 61 is provided with a pump 62, a heater 63, and a silicon concentration sensor 64. By driving the pump 62 in the state in which the heater 63 is turned on, the replenishing liquid in the circulation line 61 is heated and circulated.

In the reserve tank 60, a replenishing liquid is newly produced by immersing a dummy substrate while supplying a chemical liquid.

The substrate processing apparatus 1 according to the modification sets the supply flow rate of the chemical liquid in the reserve tank 60 based on the silicon concentration in the etching liquid, which is detected by the silicon concentration sensor 54, and the silicon concentration in the replenishing liquid of the reserve tank 60, which is detected by the silicon concentration sensor 64. The substrate processing apparatus 1 according to the modification sets the supply flow rate of the chemical liquid such that the silicon concentration in the replenishing liquid in the reserve tank 60 is equal to the silicon concentration of the etching liquid in the inner tank 44 (outer tank 45).

The replenishing liquid produced in the reserve tank 60 is supplied to the outer tank 45 via a supply line 65, which connects the reserve tank 60 and the outer tank 45. The supply line 65 is provided with a pump 66 and a fourth flow rate regulator 67.

The phosphoric acid aqueous solution supply part 40 may have a three-way valve (not shown) to switch the supply of the phosphoric acid aqueous solution to the outer tank 45 and the reserve tank 60.

In the substrate processing apparatus 1 according to the modification, since it is possible to produce the replenishing liquid in the reserve tank 60 in advance, it is possible to shorten the replenishing time of the etching liquid. In the substrate processing apparatus 1 according to the modification, the detection accuracy of silicon concentration can be improved by detecting the silicon concentration by the silicon concentration sensors 54 and 64.

Figure 9:
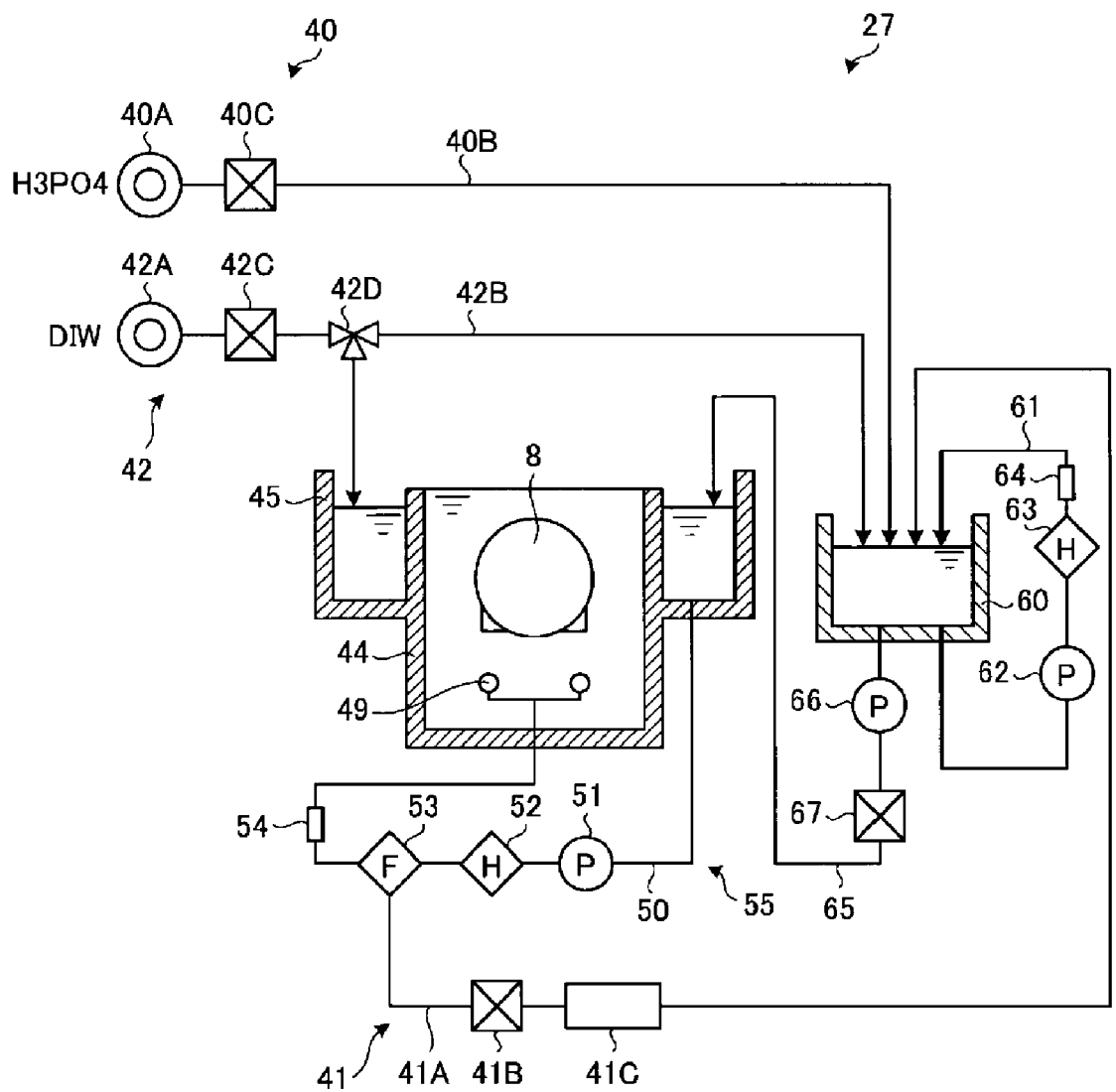
FIG. 9 is a schematic block diagram illustrating the configuration of an etching processing tank according to a modification.

As illustrated in FIG. 9, the substrate processing apparatus 1 according to the modification may supply the etching liquid discharged by the phosphoric acid aqueous solution discharge part 41 to the reserve tank 60 so as to store therein. FIG. 9 is a schematic block diagram illustrating the configuration of an etching processing tank 27 according to a modification.

In the reserve tank 60 of the substrate processing apparatus 1 according to the modification, the chemical liquid is supplied with respect to the etching liquid discharged by the phosphoric acid aqueous solution discharge part 41, the dummy substrate is immersed, and a new replenishing liquid is produced.

In the substrate processing apparatus 1 according to the modification, by using the etching liquid discharged by the phosphoric acid aqueous solution discharge part 41, it is possible to reuse the etching liquid. In the substrate processing apparatus 1 according to the modification, it is possible to reduce the amount of silicon to be dissolved from the dummy substrate, and thus it is possible to reduce costs. A part of the discharged etching liquid may be supplied from the phosphoric acid aqueous solution discharge part 41 to the reserve tank 60.

Further effects and variations can be easily derived by a person ordinarily skilled in the art. Thus, the broader aspects of the present disclosure are not limited to specific details and representative embodiments illustrated and described above. Accordingly, various modifications can be made without departing from the spirit or scope of the general inventive concept as defined by the appended claims and the equivalents thereof.

According to an aspect of an embodiment, it is possible to shorten the replenishment time of a processing liquid.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method for etching a substrate, the method comprising:
   setting a supply flow rate of a chemical liquid based on a replenishment amount of the chemical liquid and one of a dissolving amount of a silicon-containing compound per unit time and a supply flow rate of a silicon-containing compound aqueous solution;
   supplying the chemical liquid at the set supply flow rate of the chemical liquid to an etching processing tank in which a processing liquid is stored, simultaneously with adjusting a silicon concentration in the processing liquid by supplying the silicon-containing compound or the silicon-containing compound aqueous solution to the etching processing tank;
   immersing the substrate in the processing liquid having the adjusted silicon concentration;
   decreasing the supply flow rate of the chemical liquid to be lower than a reference supply flow rate of the chemical liquid at which the silicon concentration in the processing liquid is maintained at the silicon concentration in the processing liquid before supplying the chemical liquid; and
   independently supplying the chemical liquid at the decreased supply flow rate to the etching processing tank while supplying the silicon-containing compound or the silicon-containing compound aqueous solution to the etching processing tank, such that the silicon concentration after supplying the chemical liquid becomes higher than the silicon concentration in the processing liquid before supplying the chemical liquid.

2. The substrate processing method of claim 1, further comprising setting the supply flow rate of the chemical liquid based on data relating to the replenishment amount of the chemical liquid and a replenishment amount of silicon with respect to a predetermined silicon concentration.

3. The substrate processing method of claim 2, further comprising changing the data based on at least one of a temperature of the processing liquid or a concentration of the chemical liquid.

4. The substrate processing method of claim 1, further comprising:
   detecting a silicon concentration in the processing liquid, and
   when the detected silicon concentration is different from a predetermined concentration before supplying the chemical liquid, changing the set supply flow rate of the chemical liquid.

5. The substrate processing method of claim 1, further comprising:

supplying the chemical liquid to a reserve tank different from the etching processing tank, and supplying the processing liquid from the reserve tank to the etching processing tank by dissolving the silicon in the processing liquid within the reserve tank.

6. The substrate processing method of claim 5, further comprising:

supplying the chemical liquid to the processing liquid discharged from the etching processing tank and stored in the reserve tank, and dissolving the silicon in the processing liquid within the reserve tank.

7. A substrate processing method for etching a substrate, the method comprising:

setting a supply flow rate of a chemical liquid based on a replenishment amount of the chemical liquid and one of a dissolving amount of a silicon-containing compound per unit time and a supply flow rate of a silicon-containing compound aqueous solution;

supplying the chemical liquid at the set supply flow rate of the chemical liquid to an etching processing tank in which a processing liquid is stored, simultaneously with adjusting a silicon concentration in the processing liquid by supplying the silicon-containing compound or the silicon-containing compound aqueous solution to the etching processing tank;

immersing the substrate in the processing liquid having the adjusted silicon concentration;

increasing the supply flow rate of the chemical liquid to be higher than a reference supply flow rate of the chemical liquid at which the silicon concentration in the processing liquid is maintained at the silicon concentration in the processing liquid before supplying the chemical liquid; and independently supplying the chemical liquid at the increased supply flow rate to the etching processing tank while supplying the silicon-containing compound or the silicon-containing compound aqueous solution to the etching processing tank, such that the silicon concentration after supplying the chemical liquid becomes lower than the silicon concentration in the processing liquid before supplying the chemical liquid.

* * * * *